(12) United States Patent
Akiho et al.

(10) Patent No.: US 7,556,884 B2
(45) Date of Patent: Jul. 7, 2009

(54) BATTERY PACK AND THERMOSTAT USED THEREFOR

(75) Inventors: Hitoshi Akiho, Miyagi (JP); Yoshisada Okayasu, Tokyo (JP)

(73) Assignee: Sony Corporation, Tokyo (JP)

( * ) Notice: Subject to any disclaimer, the term of this patent is extended or adjusted under 35 U.S.C. 154(b) by 615 days.

(21) Appl. No.: 10/490,374

(22) PCT Filed: Aug. 21, 2002

(86) PCT No.: PCT/JP02/08429

§ 371 (c)(1),
(2), (4) Date: Mar. 23, 2004

(87) PCT Pub. No.: WO03/030280

PCT Pub. Date: Apr. 10, 2003

(65) Prior Publication Data

US 2004/0247950 A1    Dec. 9, 2004

(30) Foreign Application Priority Data

Sep. 27, 2001    (JP) .............................. 2001-297425

(51) Int. Cl.
*H01M 6/12* (2006.01)
(52) U.S. Cl. ...................... 429/162; 429/163; 429/61; 429/62
(58) Field of Classification Search .................. None
See application file for complete search history.

(56) References Cited

U.S. PATENT DOCUMENTS 5,998,051 A    12/1999  Poirier et al.
6,335,113 B1 *  1/2002  Nakatani et al. .............. 429/90
6,608,470 B1 *  8/2003  Oglesbee et al. ............ 320/136

FOREIGN PATENT DOCUMENTS

| EP | 1 033 766 | 9/2000 |
|---|---|---|
| JP | 01-126032 | 8/1989 |
| JP | 04-101373 | 9/1992 |
| JP | 07-262977 | 10/1995 |
| JP | 11-135090 | 5/1999 |
| JP | 11-224579 | 8/1999 |
| JP | 11-224663 | * 8/1999 |
| JP | 2000-149893 | 5/2000 |

OTHER PUBLICATIONS

European Search Report dated Dec. 8, 2006.

* cited by examiner

*Primary Examiner*—Patrick Ryan
*Assistant Examiner*—Cynthia Lee
(74) *Attorney, Agent, or Firm*—Sonnenschein Nath & Rosenthal LLP (57) ABSTRACT

The present invention reduces components of a circuit board and miniaturizes a battery pack using a thermostat. The battery pack includes a thermostat (9) having a casing portion (10) formed of a nonconductive material, a first electrode portion (13) disposed at one surface (10a) of the casing portion, and a second electrode portion (18) and (18) disposed at another surface (10c) opposite to the one surface of the casing portion, wherein one electrode lead (5) projected from a battery cell (3) is connected to one electrode connecting portion (7) of a circuit board (4); another electrode lead (6) is connected to the first electrode portion of the thermostat; and the second electrode portion of the thermostat is connected to another electrode connecting portion (8) of the circuit board.

12 Claims, 7 Drawing Sheets

BATTERY PACK AND THERMOSTAT USED THEREFOR

BACKGROUND OF THE INVENTION

The present invention relates to a battery pack and a thermostat used therefor, and particularly to a technical field of a battery pack in which a battery cell and a circuit board for protecting the battery cell are housed in a casing, and a thermostat used therefor.

There is a battery pack, for example a battery pack in which a lithium ion secondary battery cell is housed in a casing. Such a battery pack is used as a power supply for a communication apparatus such as a portable telephone, for example.

Figure 7:
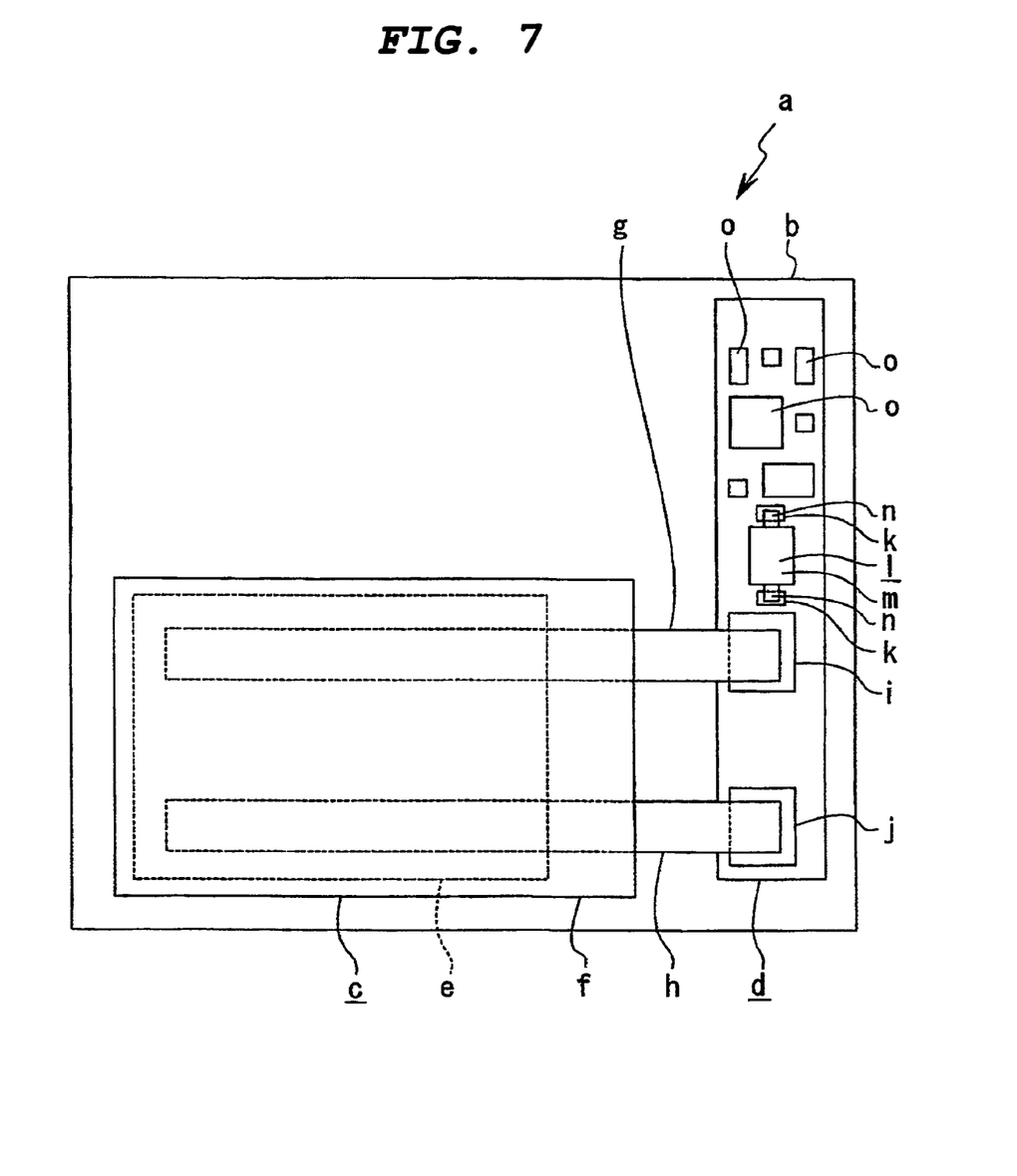
FIG. 7 is a schematic plan view of an inside of a conventional battery pack.
Figure 8:
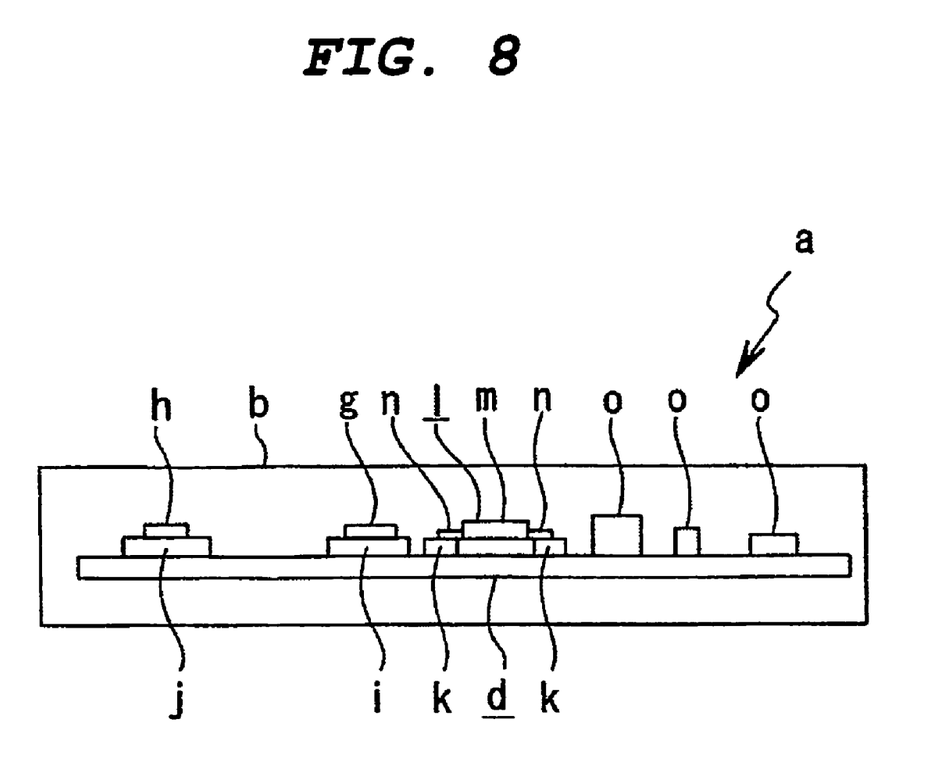
FIG. 8 is a schematic side view of the inside of the conventional battery pack.

FIG. 7 and FIG. 8 schematically show an example of a conventional battery pack.

A battery pack "a" is formed by housing a battery cell "c" such as a lithium ion secondary battery cell or the like and a circuit board "d" for protecting the battery cell "c" within a casing "b". The battery cell "c" is formed by sealing a battery main body portion "e" with a covering (aluminum laminate material) "f" made of a polymer material.

A first electrode lead "g" connected to a positive electrode of the battery cell "c" and a second electrode lead "h" connected to a negative electrode of the battery cell "c" are projected from the battery cell "c" in the same direction in a state of being separated from each other at a distance in a direction of width of the battery cell "c".

The circuit board "d" is provided with a first electrode connecting portion "i", a second electrode connecting portion "j", and thermostat connecting portions "k" and "k". An end portion of the first electrode lead "g" projected from the battery cell "c" is connected to the first electrode connecting portion "i". An end portion of the second electrode lead "h" projected from the battery cell "c" is connected to the second electrode connecting portion "j".

The circuit board "d" has a thermostat "l" mounted thereon to prevent excessive increase in temperature within the casing "b". The thermostat "l" has a casing portion "m" formed of a nonconductive material, and a pair of electrode portions "n" and "n" projected from the casing portion "m" in directions opposite to each other. The electrode portions "n" and "n" are joined to the thermostat connecting portions "k" and "k", respectively, of the circuit board "d" by soldering, for example. The thermostat "l" is situated immediately beside the first electrode connecting portion "i".

The circuit board "d" has required chip parts "o", "o", . . . such as ICs (Integrated Circuits), FETs (Field Effect Transistors), and the like mounted thereon.

However, the conventional battery pack "a" described above requires the thermostat connecting portions "k" and "k" exclusively for connecting the thermostat "l" to the circuit board "d", in addition to the first electrode connecting portion "i" and the second electrode connecting portion "j". Hence there are a correspondingly large number of components on the circuit board "d".

In addition, the thermostat "l" needs to be mounted at a position different from positions of the first electrode connecting portion "i" and the second electrode connecting portion "j" of the circuit board "d". Accordingly a space exclusively for mounting the thermostat "l" on the circuit board "d" is required, so that with an increase in size of the circuit board "d", the battery pack "a" becomes larger.

It is accordingly an object of the present invention to provide a battery pack and a thermostat used therefor that overcome the above problems to reduce components of the circuit board and miniaturize the battery pack using the thermostat.

SUMMARY OF THE INVENTION

In order to solve the above problems, according to the present invention, there is provided a battery pack including a thermostat having a casing portion formed of a nonconductive material, a first electrode portion disposed at one surface of the casing portion, and a second electrode portion disposed at another surface opposite to the one surface of the casing portion, wherein one electrode lead is connected to one electrode connecting portion of a circuit board; another electrode lead is connected to the first electrode portion of the thermostat; and the second electrode portion of the thermostat is connected to another electrode connecting portion of the circuit board.

In order to solve the above problems, according to the present invention, there is provided a thermostat for use in a battery pack. The thermostat includes a casing portion formed of a nonconductive material, a first electrode portion disposed at one surface of the casing portion and connected with another electrode lead, and a second electrode portion disposed at another surface opposite to the one surface of the casing portion and connected with another electrode connecting portion of the circuit board.

Thus, in the battery pack and the thermostat used therefor according to the present invention, one electrode portion of the thermostat functions as an electrode connecting portion to which one electrode lead is connected.

DETAILED DESCRIPTION OF THE PRESENTLY PREFERRED EMBODIMENTS

Embodiments of a battery pack and a thermostat used therefor according to the present invention will hereinafter be described with reference to the accompanying drawings.

Figure 1:
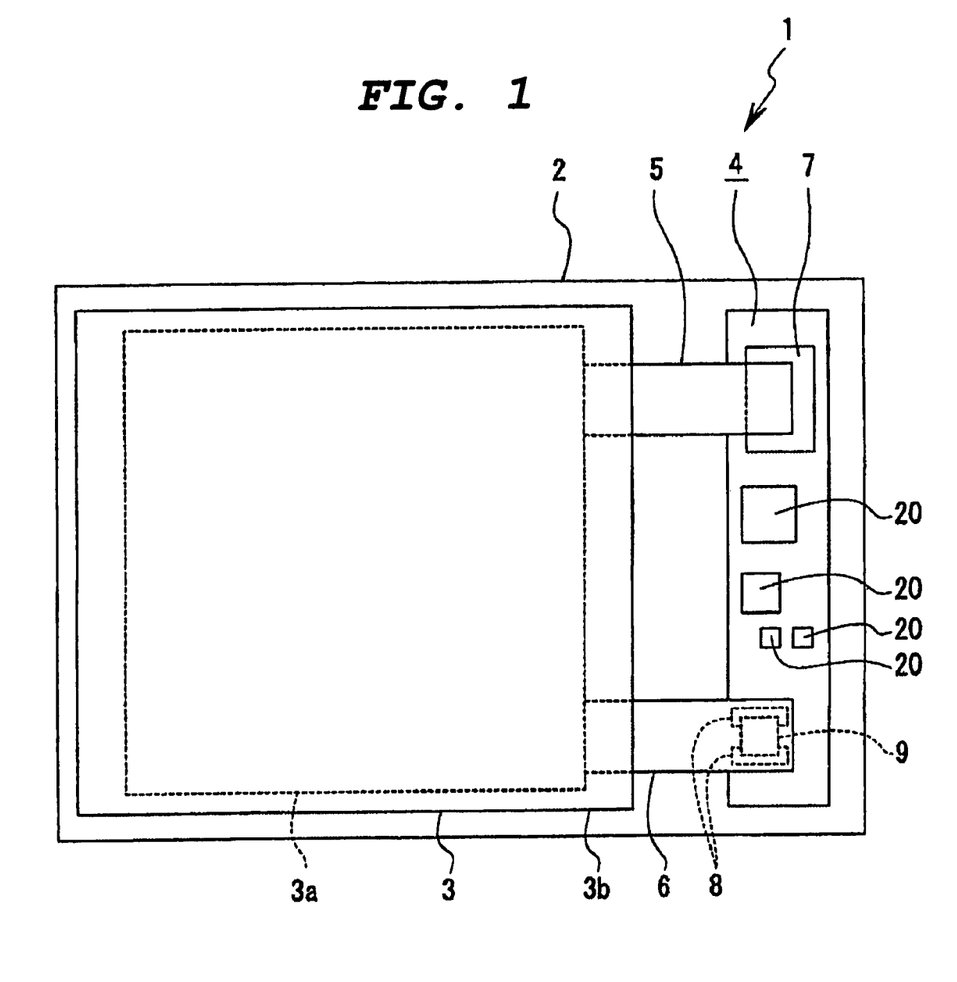
FIG. 1 shows an embodiment of a battery pack and a thermostat used therefor according to the present invention in conjunction with FIGS. 2 to 5, FIG. 1 being a schematic plan view of an inside of the battery pack.

A battery pack 1 is formed by housing a battery cell 3 such as a lithium ion secondary battery cell or the like and a circuit board 4 for protecting the battery cell 3 within a casing 2 of a flat and substantially rectangular shape (see FIG. 1). The battery cell 3 is formed by sealing a battery main body portion 3a with a covering 3b made of a polymer material.

A first electrode lead 5 connected to a positive electrode of the battery main body portion 3a and a second electrode lead 6 connected to a negative electrode of the battery main body portion 3a, for example, are projected from the battery cell 3 in the same direction in a state of being separated from each other at a distance in a direction of width of the battery cell 3

(see FIG. 1). The first electrode lead 5 is formed of an aluminum material, and the second electrode lead 6 is formed of a nickel material.

The circuit board 4 is formed in a rectangular shape that is long in the direction of width of the battery cell 3. The circuit board 4 has a first electrode connecting portion 7 and a second electrode connecting portion 8 provided at both respective end portions in a direction of length of the circuit board 4. An end portion of the first electrode lead 5 projected from the battery cell 3 is connected to the first electrode connecting portion 7 by welding, for example (see FIG. 1 and FIG. 2).

Figure 2:
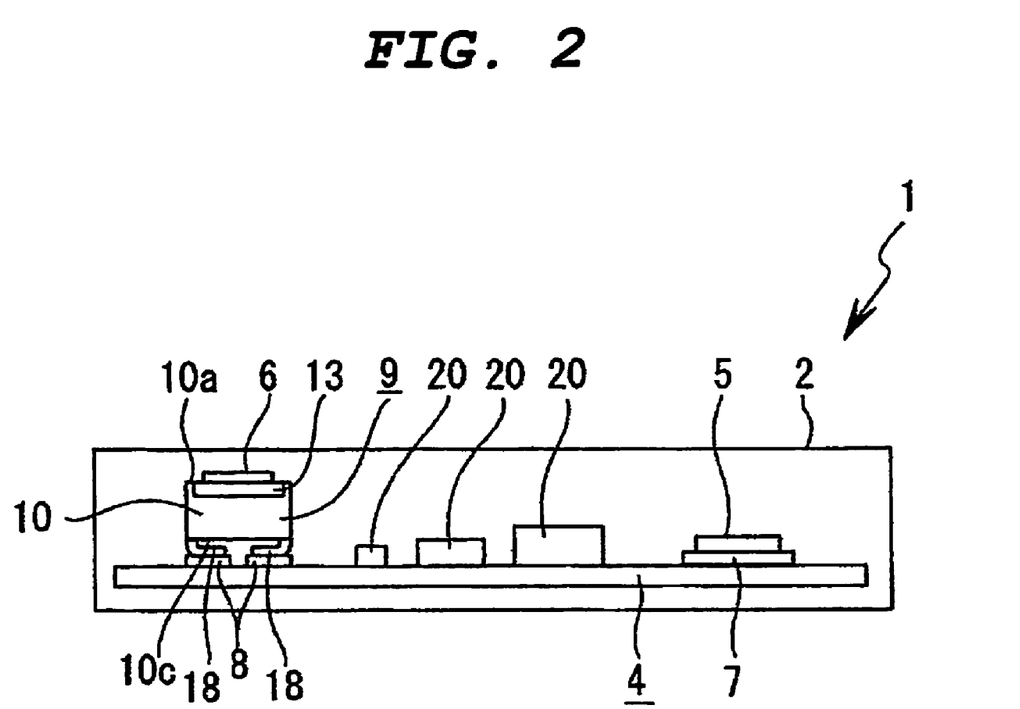
FIG. 2 is a schematic side view of the inside of the battery pack.

The circuit board 4 has a thermostat 9 mounted thereon to prevent excessive increase in temperature within the casing 2 (see FIG. 1 and FIG. 2).

The thermostat 9 is formed in substantially a shape of a rectangular parallelepiped. The thermostat 9 has a casing portion 10 formed of a nonconductive material, a first conductive portion 11 formed by a plate-shaped metallic material, and a second conductive portion 12 similarly formed by a plate-shaped metallic material (see FIGS. 3 to 5).

Figure 4:
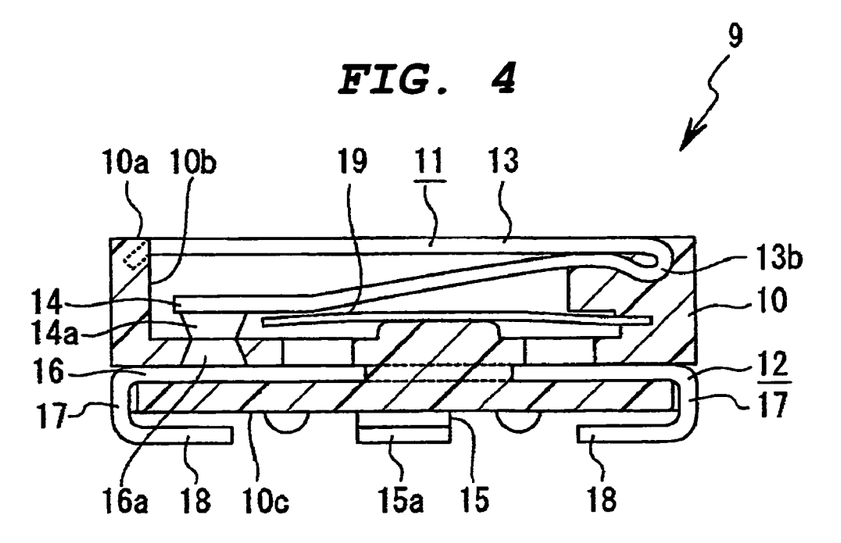
FIG. 4 is an enlarged sectional view of the thermostat.

The casing portion 10 has a disposing recess portion 10b that opens on a side of one surface 10a (see FIG. 4).

Figure 3:
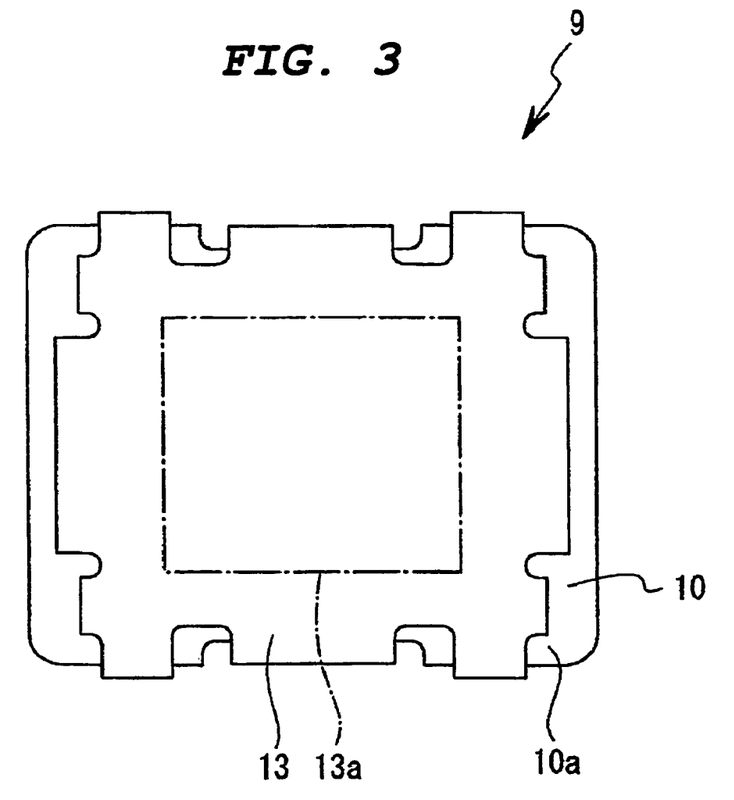
FIG. 3 is an enlarged plan view of the thermostat.
Figure 5:
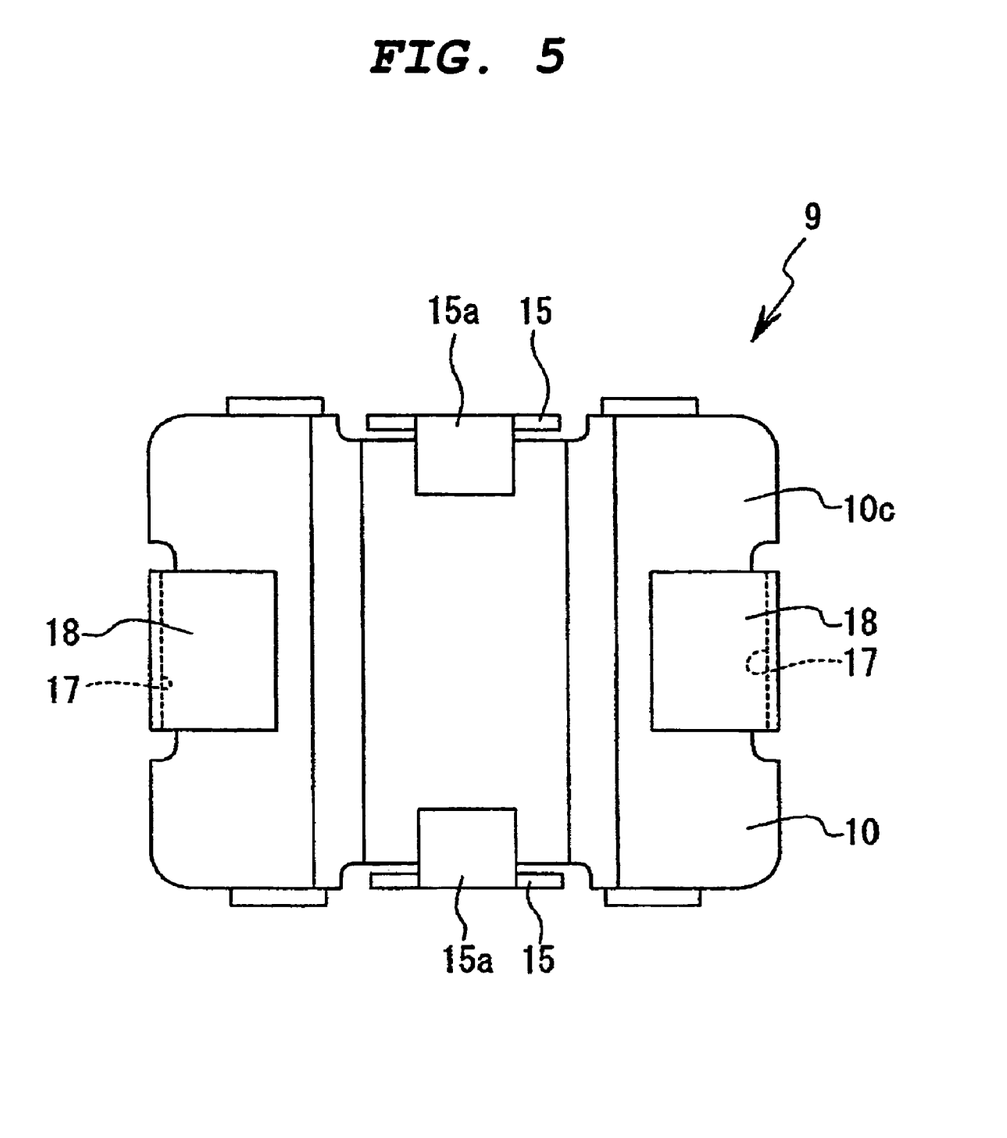
FIG. 5 is an enlarged bottom plan view of the thermostat.

The first conductive portion 11 has a first electrode portion 13, a movable piece portion 14, and auxiliary electrode portions 15 and 15 (see FIGS. 3 to 5).

The first electrode portion 13 is disposed on the side of one surface 10a so as to cover the disposing recess portion 10b of the casing portion 10. A portion (a portion enclosed by alternate long and short dashed lines in FIG. 3) excluding a peripheral portion of the first electrode portion 13 is formed as a welding portion area 13a.

The movable piece portion 14 is formed by bending over from one edge 13b of the first electrode portion 13. The movable piece portion 14 is capable of elastic displacement with respect to the first electrode portion 13. The movable piece portion 14 has a contact portion 14a provided at an end portion thereof, and the contact portion 14a is projected in a direction opposite to a side where the first electrode portion 13 is situated.

The auxiliary electrode portions 15 and 15 are respectively projected from both side edges orthogonal to the one edge 13b of the first electrode portion 13 in a direction orthogonal to the first electrode portion 13. The auxiliary electrode portions 15 and 15 have end portions formed as connecting portions 15a and 15a. The connecting portions 15a and 15a are bent perpendicularly to be parallel with the first electrode portion 13, and is situated so as to be opposed to a part of another surface 10c of the casing portion 10. The surface 10c is opposite to the one surface 10a of the casing portion 10 (see FIG. 4 and FIG. 5).

The second conductive portion 12 includes a base portion 16, connecting portions 17 and 17, and second electrode portions 18 and 18 (see FIG. 4 and FIG. 5).

The base portion 16 is buried on an opposite side from the first electrode portion 13 in parallel with the first electrode portion 13 with the movable piece portion 14 interposed between the first electrode portion 13 and the base portion 16 within the casing portion 10. A contact portion 16a projecting to a side of the contact portion 14a is provided at a position opposed to the contact portion 14a of the movable piece portion 14.

The connecting portions 17 and 17 are formed by being bent perpendicularly from both edges of the base portion 16 in a direction opposite to a side where the first conductive portion 11 is situated.

The second electrode portions 18 and 18 are formed by being bent perpendicularly from both edges of the connecting portions 17 and 17, and are situated so as to be opposed to a part of the other surface 10c of the casing portion 10 (see FIG. 4 and FIG. 5). The second electrode portions 18 and 18 are situated so as to be separated from each other at a distance in a direction orthogonal to a direction to connect the connecting portions 15a and 15a of the auxiliary electrode portions 15 and 15 with each other (see FIG. 5).

Thus, the second electrode portions 18 and 18 and the auxiliary electrode portions 15 and 15 of the thermostat 9 are disposed inside an outline of the other surface 10c of the casing portion 10 (see FIG. 5).

A bimetallic disk 19 is disposed between the movable piece portion 14 of the first conductive portion 11 and the base portion 16 of the second conductive portion 12 within the casing portion 10 (see FIG. 4). The bimetallic disk 19 has one end portion buried in the casing portion 10, and another end portion situated so as to correspond to a position near an end of the movable piece portion 14.

When due to generation of heat from an outside or the like of the battery cell 3 and the battery pack 1, the temperature within the casing 2 increases and reaches a predetermined temperature, the bimetallic disk 19 is bent in a direction to approach the movable piece portion 14, and presses the movable piece portion 14 in a direction to approach the first electrode portion 13, so that the contact portion 14a of the movable piece portion 14 and the contact portion 16a of the base portion 16 in contact with each other are separated from each other. Thus, the first conductive portion 11 and the second conductive portion 12 are electrically disconnected from each other to prevent excessive increase in temperature within the casing 2.

The circuit board 4 has required chip parts 20, 20, ... such as ICs, FETs, and the like mounted thereon at a position between the first electrode connecting portion 7 and the second electrode connecting portion 8 (see FIG. 1 and FIG. 2).

The second electrode portions 18 and 18 of the thermostat 9 are connected to the second electrode connecting portion 8 of the circuit board 4 (see FIG. 1 and FIG. 2). The second electrode portions 18 and 18 are connected to the second electrode connecting portion 8 by so-called reflow soldering performed by melting soldering paste by a hot air, infrared rays, or the like at the same time as the other chip parts 20, 20, ... , for example.

In a state in which the first electrode lead 5 is connected to the first electrode connecting portion 7 of the circuit board 4 and the second electrode portions 18 and 18 of the thermostat 9 are connected to the second electrode connecting portion 8 as described above, an end portion of the second electrode lead 6 is welded and connected to the welding portion area 13a of the first electrode portion 13 of the thermostat 9 (see FIG. 1 and FIG. 2).

Incidentally, the auxiliary electrode portions 15 and 15 of the thermostat 9 are intended to enable use of the thermostat 9 even in a conventional battery pack by connecting the connecting portions 15a and 15a of the auxiliary electrode portions 15 and 15 separate from the second electrode portions 18 and 18 to a thermostat connecting portion of a circuit board used in the conventional battery pack.

As described above, the battery pack 1 uses the thermostat 9 having the first electrode portion 13 disposed in the one surface 10a of the casing portion 10 and the second electrode portions 18 and 18 disposed at the other surface 10c of the casing portion 10. The second electrode lead 6 projected from the battery main body portion 3a is connected to the first electrode portion 13, and the second electrode portions 18 and 18 are connected to the second electrode connecting portion 8 of the circuit board 4.

Thus, the battery pack 1 eliminates the need for providing a portion exclusively for connecting the thermostat 9 on the circuit board 4 in addition to a portion for connecting each of the first electrode lead 5 and the second electrode lead 6. It is therefore possible to reduce components of the circuit board 4 and simplify a configuration of the circuit board 4.

Further, since a portion for connecting the second electrode lead 6 is not required on the circuit board 4, a disposing space for disposing required parts and the like on the circuit board 4 can be reduced. By correspondingly reducing size of the circuit board 4, the battery pack 1 can be miniaturized.

Further, since the second electrode portions 18 and 18 of the thermostat 9 are disposed inside the outline of the other surface 10c of the casing portion 10 as described above, a disposing space for disposing the thermostat 9 on the circuit board 4 can be further reduced, thus further miniaturizing the battery pack 1.

It is to be noted that in the description above, the first electrode lead 5 is connected to the first electrode connecting portion 7 of the circuit board 4 and the second electrode lead 6 is connected to the first electrode portion 13 of the thermostat 9; conversely, however, the second electrode lead 6 may be connected to the first electrode connecting portion 7 of the circuit board 4 and the first electrode lead 5 may be connected to the first electrode portion 13 of the thermostat 9.

Figure 6:
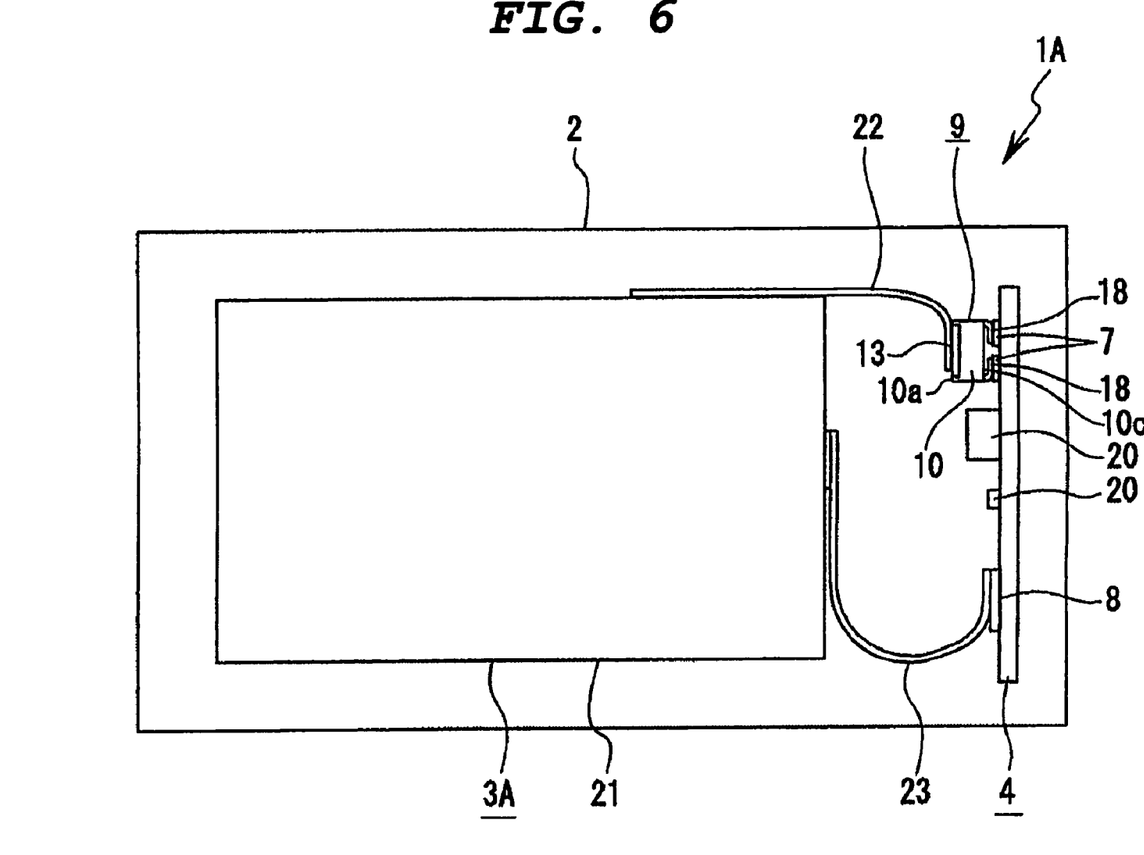
FIG. 6 is a schematic plan view of an inside of another type of battery pack.

Also, while the description above has shown the battery pack 1 in which the battery cell 3 formed by sealing the battery main body portion 3a with the covering 3b made of a polymer material is housed within the casing 2, the present invention is applicable to a battery pack 1A housing a battery cell 3A formed by disposing required parts within a battery can 21 formed of an aluminum material, as shown in FIG. 6.

In the battery pack 1A, one end portion of a first connecting lead 22 provided as a first electrode lead is connected to a positive electrode (battery can 21) of the battery cell 3A, and one end portion of a second connecting lead 23 provided as a second electrode lead is connected to a negative electrode of the battery cell 3A.

Another end portion of the first connecting lead 22 is connected to a first electrode connecting portion 7 of a circuit board 4, and another end portion of the second connecting lead 23 is connected by welding to a first electrode portion 13 of a thermostat 9 connected to a second electrode connecting portion 8 of the circuit board 4.

Thus, the battery pack 1A also eliminates the need for providing a portion exclusively for connecting the thermostat 9 on the circuit board 4 in addition to a portion for connecting each of the first connecting lead 22 and the second connecting lead 23. It is therefore possible to reduce components of the circuit board 4 and simplify a configuration of the circuit board 4.

Further, since a portion for connecting the second connecting lead 23 is not required on the circuit board 4, a disposing space for disposing required parts and the like on the circuit board 4 can be reduced. By correspondingly reducing size of the circuit board 4, the battery pack 1A can be miniaturized.

All the concrete shapes and structures of the parts shown in the foregoing embodiments are mere examples of embodiment in carrying out the present invention; they are not to be construed as restrictive of the technical scope of the present invention.

As is clear from the above description, a battery pack according to the present invention in which a battery cell and a circuit board having a pair of electrode connecting portions are housed in a casing and a pair of electrode leads each connected to a positive electrode or a negative electrode of the battery cell is projected from the battery cell includes a thermostat having a casing portion formed of a nonconductive material, a first electrode portion disposed at one surface of the casing portion, and a second electrode portion disposed at another surface opposite to the one surface of the casing portion, wherein one electrode lead is connected to one electrode connecting portion of the circuit board; the other electrode lead is connected to the first electrode portion of the thermostat; and the second electrode portion of the thermostat is connected to the other electrode connecting portion of the circuit board.

Thus, it is not necessary to provide a portion exclusively for connecting the thermostat on the circuit board in addition to a portion for connecting each of the one electrode lead and the other electrode lead. It is therefore possible to reduce components of the circuit board and simplify a configuration of the circuit board.

Further, since a portion for connecting the other electrode lead is not required on the circuit board, a disposing space for disposing required parts and the like on the circuit board can be reduced. By correspondingly reducing size of the circuit board, the battery pack can be miniaturized.

Further, in the present invention, the second electrode portion of the thermostat is disposed inside the outline of the other surface of the casing portion. Therefore a disposing space for disposing the thermostat on the circuit board can be further reduced, thus further miniaturizing the battery pack.

A thermostat according to the present invention for use in a battery pack in which a battery cell and a circuit board having a pair of electrode connecting portions are housed in a casing and one of a pair of electrode leads each connected to a positive electrode or a negative electrode of the battery cell is connected to one electrode connecting portion of the circuit board includes a casing portion formed of a nonconductive material, a first electrode portion disposed at one surface of the casing portion and connected with the other electrode lead, and a second electrode portion disposed at another surface opposite to the one surface of the casing portion and connected with the other electrode connecting portion of the circuit board.

Thus, it is not necessary to provide a portion exclusively for connecting the thermostat on the circuit board in addition to a portion for connecting each of the one electrode lead and the other electrode lead. It is therefore possible to reduce components of the circuit board and simplify a configuration of the circuit board.

Further, since a portion for connecting the other electrode lead is not required on the circuit board, a disposing space for disposing required parts and the like on the circuit board can be reduced. By correspondingly reducing size of the circuit board, the battery pack using the thermostat can be miniaturized.

Further, in the present invention, the second electrode portion is disposed inside the outline of the other surface of the casing portion. Therefore a disposing space for disposing the thermostat on the circuit board can be further reduced, thus further miniaturizing the battery pack using the thermostat.

The invention claimed is:

1. A battery pack, comprising:
   a battery cell with a positive electrode and a negative electrode;
   a circuit board having first and second electrode connecting portions;
   a battery pack casing in which the battery cell and the circuit board are housed;

first and second electrode leads projecting from said battery cell and respectively electrically connected to the positive electrode and the negative electrode of the battery cell; and a thermostat having (a) a thermostat casing a portion of which is formed of a nonconductive material, and (b) first and second electrode portions each having oppositely facing exposed portions at upper and lower major surfaces of the thermostat casing, the first electrode exposed portion forming a first portion of the upper major surface of the thermostat casing, wherein, the first electrode lead is connected to the circuit board by the first electrode connecting portion, the second electrode lead is connected to the exposed portion of the first electrode portion of the thermostat, the exposed portion of the second electrode portion of the thermostat is connected to the second electrode connecting portion of the circuit board such that said thermostat is sandwiched between the second electrode lead and second electrode connecting portion of the circuit board, and the first electrode is partially embedded in the casing portion via a recessed portion therein.

2. The battery pack as claimed in claim 1, wherein the second electrode portion of said thermostat is disposed within an outline of an outer perimeter of the thermostat casing.

3. A thermostat which can be used in a battery pack, in which (a) a battery cell with positive and negative electrodes and a circuit board having a pair of electrode connecting portions are housed in a first casing, (b) there are a pair of electrode leads respectively connected to the positive electrode and the negative electrode of the battery cell, (c) one of the electrode leads is connected to one electrode connecting portion of the circuit board, said thermostat comprising:

a second casing with a portion formed of a nonconductive material;

a first electrode portion forming one major surface of the second casing and connectable with the other electrode lead of the battery cell;

a second electrode portion disposed at another oppositely facing major surface of the second casing and connectable with the other electrode connecting portion of said circuit board;

auxiliary electrode portions projecting from side edges of the thermostat casing; and end portions of the auxiliary electrode portions formed as auxiliary electrode connecting portions, wherein the end portions are perpendicular to the auxiliary electrode portions, wherein said thermostat is sandwiched between said other electrode of said battery cell and said other electrode connecting portion of said circuit board.

4. The thermostat as claimed in claim 3, wherein said second electrode portion is disposed within an outer perimeter of the second casing.

5. The battery pack as claimed in claim 3, wherein the auxiliary electrode connecting portions are bent perpendicularly to be parallel with the first electrode portion, and are situated so as to be opposed to a part of another surface 10c of the casing portion 10.

6. A battery pack comprising:

a battery cell with a positive electrode and a negative electrode;

a circuit board having first and second electrode connecting portions;

a battery pack casing in which the battery cell and the circuit board are housed;

first and second electrode leads projecting from said battery cell and respectively electrically connected to the positive electrode and the negative electrode of the battery cell;

a thermostat having (a) a thermostat casing a portion of which is formed of a nonconductive material, and (b) first and second electrode portions each having oppositely facing exposed portions at upper and lower major surfaces of the thermostat casing, the first electrode exposed portion forming a first portion of the upper major surface of the thermostat casing; and a movable piece portion of the first electrode portion that is bent from one edge of the first electrode portion, wherein, the first electrode lead is connected to the circuit board by the first electrode connecting portion, the second electrode lead is connected to the exposed portion of the first electrode portion of the thermostat, the exposed portion of the second electrode portion of the thermostat is connected to the second electrode connecting portion of the circuit board such that said thermostat is sandwiched between the second electrode lead and second electrode connecting portion of the circuit board, and wherein the movable piece portion is capable of elastic displacement with respect to the first electrode portion.

7. The battery pack as claimed in claim 1, further comprising:

second and third portions of the upper major surface of the thermostat casing, wherein the second and third portions are coplanar to the first portion of the upper major surface of the first electrode exposed portion.

8. The battery pack as claimed in claim 7, wherein the second and third portions of the upper major surface of the thermostat casing are formed of a nonconductive material.

9. The battery pack as claimed in claim 7, wherein the first portion of the upper major surface of the first electrode exposed portion is situated between the second and third portions of the upper major surface of the thermostat casing.

10. The battery pack as claimed in claim 3, further comprising:

second and third major surfaces of the second casing, wherein the second and third major surfaces are coplanar to the first major surface of the second casing.

11. The battery pack as claimed in claim 10, wherein the second and third major surfaces of the second casing are formed of a nonconductive material.

12. The battery pack as claimed in claim 10, wherein the first major surface of the second casing is situated between the second and third major surfaces of the second casing.

* * * * *